(12) United States Patent
Loy et al.

(10) Patent No.: US 11,152,380 B2
(45) Date of Patent: Oct. 19, 2021

(54) MEMORY DEVICE AND A METHOD FOR FORMING THE MEMORY DEVICE

(71) Applicant: GLOBALFOUNDRIES Singapore Pte. Ltd., Singapore (SG)

(72) Inventors: Desmond Jia Jun Loy, Singapore (SG); Eng Huat Toh, Singapore (SG); Bin Liu, Singapore (SG); Shyue Seng Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/532,522

(22) Filed: Aug. 6, 2019

(65) Prior Publication Data

US 2021/0043637 A1 Feb. 11, 2021

(51) Int. Cl.
*H01L 27/112* (2006.01)
*H01L 29/36* (2006.01)
(Continued)

(52) U.S. Cl.
CPC ........ *H01L 27/11206* (2013.01); *G11C 17/16* (2013.01); *G11C 17/18* (2013.01);
(Continued)

(58) Field of Classification Search
CPC .................. H01L 23/5252; H01L 29/36; H01L 27/11206; H01L 21/266; H01L 21/26513;
(Continued)

(56) References Cited

U.S. PATENT DOCUMENTS 7,423,903 B2  9/2008  Lin et al.
9,613,714 B1 *  4/2017  Wong ..................... G11C 17/18
(Continued)

OTHER PUBLICATIONS

Hsiao et al., "A New High-Density Twin-Gate Isolation One-Time Programmable Memory Cell in Pure 28-nm CMOS Logic Process", IEEE Transactions on Electron Devices, Jan. 2015, pp. 121-127, vol. 62, No. 1, IEEE.

(Continued)

*Primary Examiner* — Vongsavanh Sengdara
(74) *Attorney, Agent, or Firm* — Viering Jentschura & Partner MBB

(57) ABSTRACT

A memory device may include a first conductivity region, and second and third conductivity regions arranged at least partially within the first conductivity region. The first and second conductivity regions may have a different conductivity type from at least a part of the third conductivity region. The memory device may include first and second gates arranged over the third conductivity region. The second conductivity region may be coupled to a source line, and the gates may be coupled to respective word lines. When a predetermined write voltage difference is applied between the source line and a word line, an oxide layer of the gate coupled to the word line may break down to form a conductive link between the gate electrode of the gate and the third conductivity region. The memory device may have a smaller cell area, and may be capable of operating at both higher and lower voltages.

15 Claims, 10 Drawing Sheets

(51) Int. Cl.
  H01L 21/265 (2006.01)
  G11C 17/18 (2006.01)
  H01L 21/762 (2006.01)
  H01L 23/525 (2006.01)
  G11C 17/16 (2006.01)
  H01L 21/266 (2006.01)
(52) U.S. Cl.
  CPC ...... H01L 21/266 (2013.01); H01L 21/26513 (2013.01); H01L 21/76224 (2013.01); H01L 23/5252 (2013.01); H01L 29/36 (2013.01)
(58) Field of Classification Search
  CPC ... H01L 21/76224; G11C 17/18; G11C 17/16; G11C 17/165
  See application file for complete search history.

(56) References Cited

U.S. PATENT DOCUMENTS

| | | | | |
|---|---|---|---|---|
| 2010/0149879 | A1* | 6/2010 | Haggag | G11C 16/0416 365/185.28 |
| 2014/0056051 | A1* | 2/2014 | Wu | H01L 27/11206 365/104 |
| 2014/0340955 | A1* | 11/2014 | Wu | H01L 27/11206 365/104 |
| 2017/0053925 | A1* | 2/2017 | Wong | H01L 23/5252 |
| 2017/0053926 | A1* | 2/2017 | Wong | H01L 23/5252 |

OTHER PUBLICATIONS

Peng et al., "A New High Density FinFET OTP Technology", Extended Abstracts of the 2015 International Conference on Solid State Devices and Materials, 2015, pp. 1192-1193.

Peng et al., "High-Density FinFET One-Time Programmable Memory Cell With Intra-Fin-Cell-Isolation Technology", IEEE Electron Device Letters, Oct. 2015, pp. 1037-1039, vol. 36, No. 10, IEEE.

Pan et al., "1Kbit FinFET Dielectric (FinD) RRAM in Pure 16nm FinFET CMOS Logic Process", 2015, 4 pages, IEEE.

Ememory Technology Inc., "Neo MTP", www.ememory.com.tw/html/products_neomtp.php (retrieved on Jul. 9, 2019), 6 pages.

Bae et al., "All oxide semiconductor-based bidirectional vertical p-n-p selectors for 3D stackable crossbar-array electronics", Scientific Reports (www.nature.com/scientificreports), Aug. 2015, pp. 1-11.

* cited by examiner

MEMORY DEVICE AND A METHOD FOR FORMING THE MEMORY DEVICE

TECHNICAL FIELD

The present disclosure relates generally to memory devices and methods for forming the memory devices.

BACKGROUND

Non-volatile memory devices are often used in consumer electronic products such as smart phones and tablets. These memory devices may be in the form of one-time programmable (OTP) memory devices or multi-time programmable (MTP) memory devices.

One type of non-volatile memory device is the anti-fuse memory device which uses gate oxide breakdown to program bits. Such an anti-fuse memory device may include a plurality of transistors arranged in series. For example, the memory device may include a pair of transistors for programming each bit. Each pair of transistors may include a select transistor and a program transistor. The select transistor may have a select gate coupled to a word line and a drain region coupled to a bit line; whereas, the program transistor may have a program gate coupled to a source line. The source region of the select transistor and the drain region of the program transistor may be integrated as a single diffusion region. To program a bit of the memory device, a voltage may be applied to the select gate of the corresponding select transistor to turn on the channel of the select transistor, and a voltage difference may be applied between the corresponding source line and bit line. Because the channel of the select transistor is on, the voltage at the bit line is passed to the single diffusion region. The voltage difference between the program gate (coupled to the source line) and the single diffusion region may then cause the gate oxide under the program gate to break down to program the bit. To read a bit of the memory device, the channel of the corresponding select transistor may be turned on by applying a voltage to the select gate and the corresponding source line may be raised to a predetermined voltage. The state of the bit may then be determined based on the magnitude of the current flow through the channel of the select gate. In particular, a higher current flow through the channel of the select gate indicates the presence of a conductive link between the program gate and the single diffusion region, or in other words, indicates that the gate oxide under the program gate has broken down, and the bit is programmed.

Anti-fuse memory devices are typically large in size. Further, there is often voltage leakage between neighbouring pairs of transistors, which can lead to inadvertent programming of unselected bits in the memory device. To reduce such voltage leakage, several anti-fuse memory devices further include an isolation feature between neighbouring pairs of transistors. However, this can considerably increase the size of the memory devices.

Accordingly, it is desirable to provide a more compact memory device with reduced errors caused by voltage leakage within the device.

SUMMARY

According to various non-limiting embodiments, there may be provided a memory device that may include: a first conductivity region that may have a first conductivity type; a second conductivity region that may be arranged at least partially within the first conductivity region, wherein the second conductivity region may be coupled to a source line and may have the first conductivity type; a third conductivity region that may be arranged at least partially within the first conductivity region, wherein at least a part of the third conductivity region may have a second conductivity type different from the first conductivity type; a first gate that may be arranged over the third conductivity region and that may be coupled to a first word line, wherein the first gate may include a first gate electrode and a first oxide layer; and a second gate that may be arranged over the third conductivity region and that may be coupled to a second word line, wherein the second gate may include a second gate electrode and a second oxide layer. The first oxide layer may be configured to break down to form a conductive link between the first gate electrode and the third conductivity region when a predetermined write voltage difference is applied between the source line and the first word line. The second oxide layer may be configured to break down to form a conductive link between the second gate electrode and the third conductivity region when the predetermined write voltage difference is applied between the source line and the second word line.

According to various non-limiting embodiments, there may be provided a method that may include providing a first conductivity region that may have a first conductivity type; forming a second conductivity region at least partially within the first conductivity region, wherein the second conductivity region may have the first conductivity type; forming a third conductivity region at least partially within the first conductivity region, wherein at least a part of the third conductivity region may have a second conductivity type different from the first conductivity type; forming a first gate and a second gate over the third conductivity region, wherein the first gate may include a first gate electrode and a first oxide layer, and the second gate may include a second gate electrode and a second oxide layer; and coupling the second conductivity region to a source line, the first gate to a first word line and the second gate to a second word line. The first oxide layer may be configured to break down to form a conductive link between the first gate electrode and the third conductivity region when a predetermined write voltage difference is applied between the source line and the first word line. The second oxide layer may be configured to break down to form a conductive link between the second gate electrode and the third conductivity region when the predetermined write voltage difference is applied between the source line and the second word line.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments of the invention will now be illustrated for the sake of example only with reference to the following drawings, in which.

DETAILED DESCRIPTION

Figure 1A:
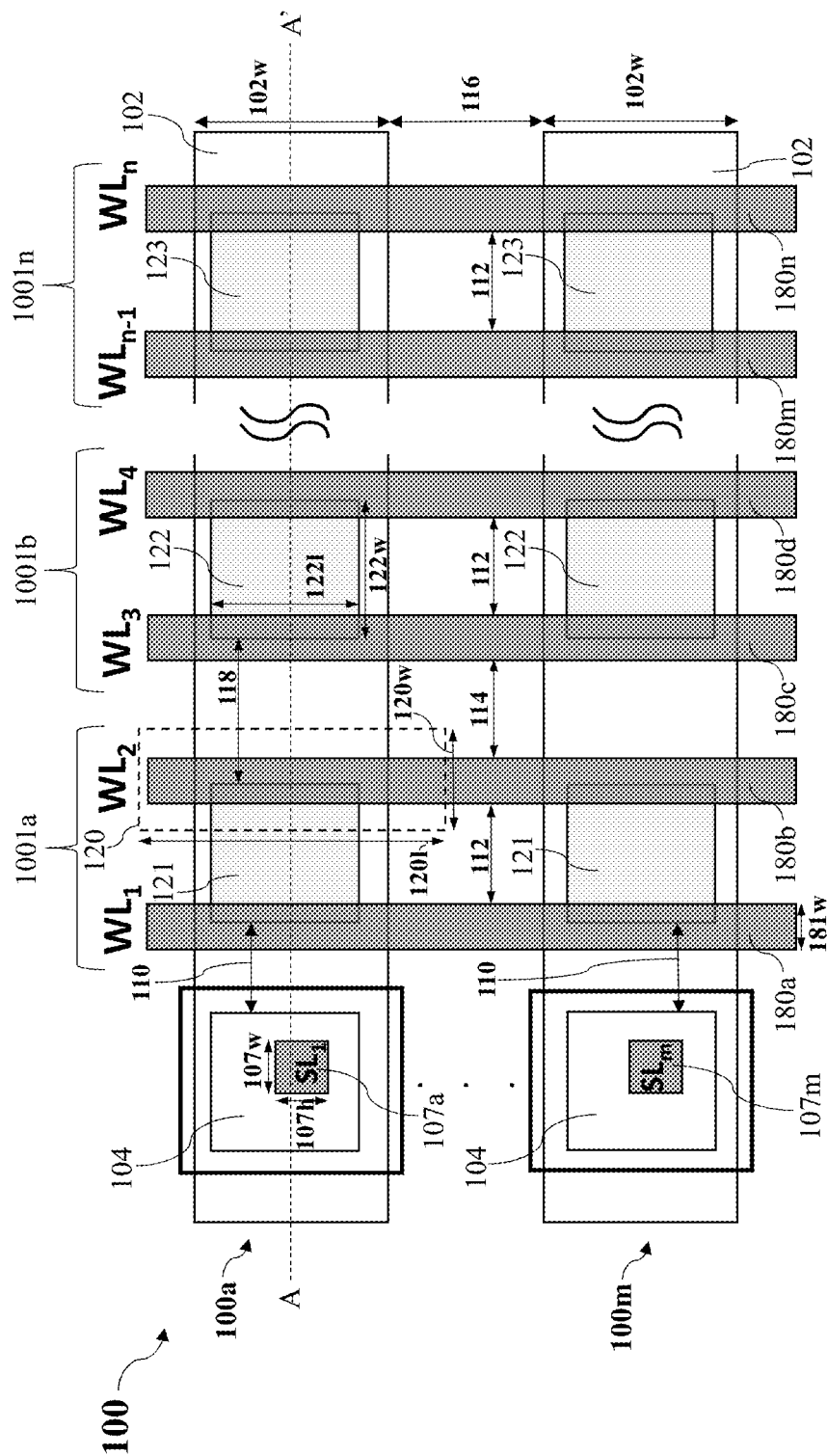
FIG. 1A shows a top view of a memory device according to various non-limiting embodiments.

The embodiments generally relate to devices, such as semiconductor devices. More particularly, some embodiments relate to memory devices, for example, non-volatile memory devices such as anti-fuse memory devices that may include resistive random access memory (RRAM) devices.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include"(and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

FIG. 1A shows a top view of a memory device 100 according to various non-limiting embodiments. The memory device 100 may be a non-volatile memory device, such as an anti-fuse memory device (for example, a RRAM device in a non-limiting example). The memory device 100 may be an OTP memory device in various non-limiting embodiments or a unipolar MTP memory device in alternative non-limiting embodiments.

As shown in FIG. 1A, the memory device 100 may include a plurality of memory segments 100a-100m substantially similar to each other. The memory segments 100a-100m may share word lines ($WL_1$-$WL_n$) 180a-180n and may be coupled to different source lines ($SL_1$-$SL_m$) 107a-107m. Each source line ($SL_1$-$SL_m$) 107a-107m may be a conductive line to which a voltage may be applied to indicate the type of operation (e.g. read/program) to be performed on the memory device 100. Each word line ($WL_1$-$WL_n$) 180a-180n may be a conductive line to which a voltage may be applied to select a particular bitcell for the operation (e.g. read/program). Although FIG. 1A shows a plurality of memory segments 100a-100m, it is understood that the memory device 100 may alternatively include only one memory segment in various non-limiting embodiments.

Figure 1B:
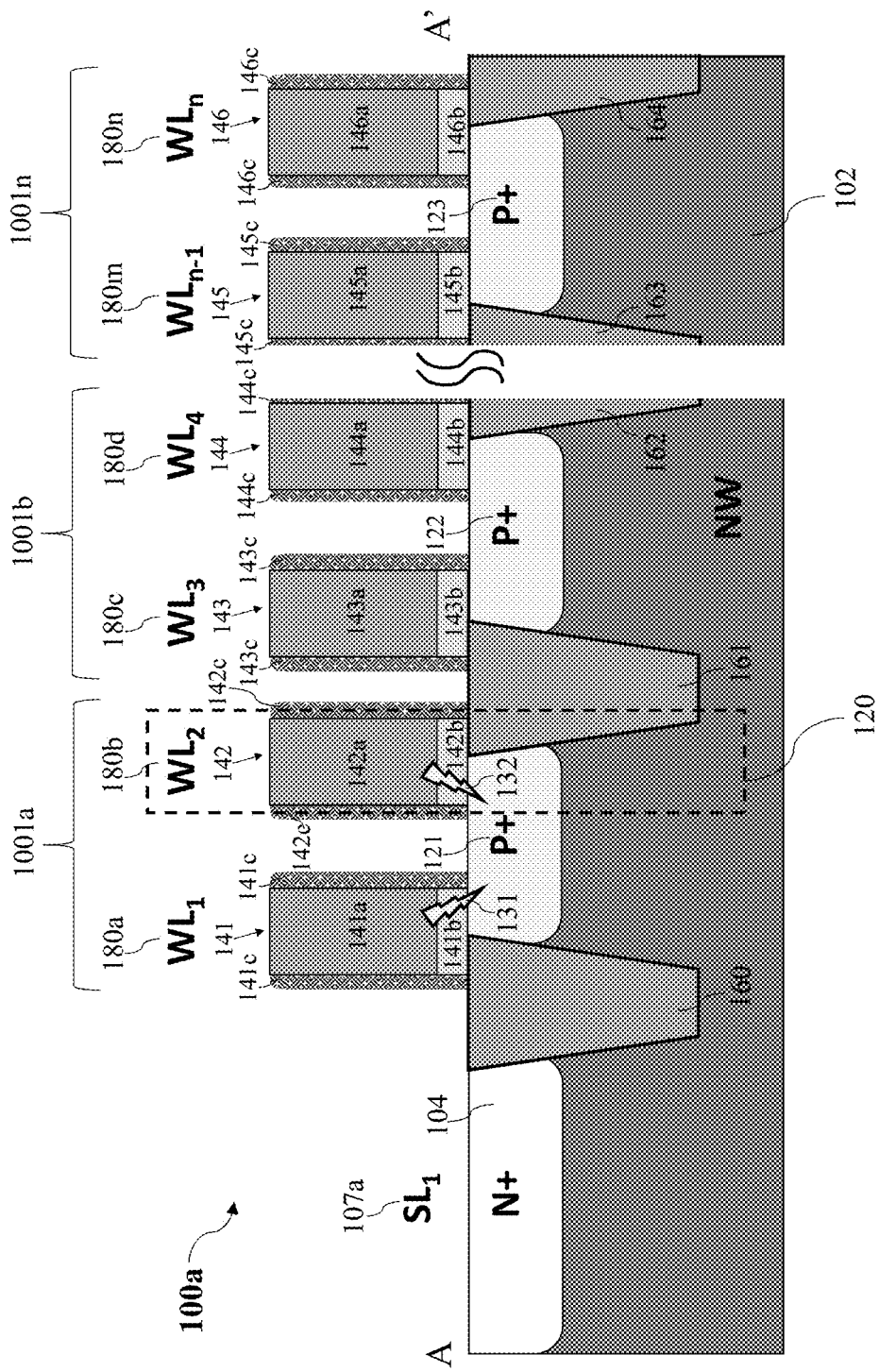
FIG. 1B shows a cross-sectional view of a memory segment of the memory device of FIG. 1A.

FIG. 1B shows a simplified cross-sectional view of the memory segment 100a along the line A-A'. Referring to FIG. 1B, the memory segment 100a may include a first conductivity region 102 that may be a well region in various non-limiting embodiments. The memory segment 100a may further include a second conductivity region 104 arranged at least partially within the first conductivity region 102. Both the first conductivity region 102 and the second conductivity region 104 may have a first conductivity type. In various non-limiting embodiments, the first conductivity type may be N type. In other words, the first conductivity region 102 and the second conductivity region 104 may include N type dopants. Accordingly, the first conductivity region 102 may be an N-well region (NW) and the second conductivity region 104 may be an N+ region in some exemplary non-limiting embodiments. However, the first conductivity type may be P type in alternative non-limiting embodiments. In other words, the first conductivity region 102 and the second conductivity region 104 may include P type dopants, and in some exemplary non-limiting embodiments, the first conductivity region 102 may be a P-well region (PW) and the second conductivity region 104 may be a P+ region.

The memory segment 100a may include a plurality of memory cells 1001a, 1001b-1001n, where each memory cell 1001a-1001n may be a two bit memory cell in various non-limiting embodiments. However, in alternative non-limiting embodiments, the memory segment 100a may include a mixture of two bit memory cells and one bit memory cells (for example, when the memory segment 100a includes an odd number of gates such that the last memory cell may be a one bit memory cell).

Referring to FIG. 1B, a first memory cell 1001a may include a third conductivity region 121 at least partially arranged within the first conductivity region 102. At least a part of the third conductivity region 121 may have a second conductivity type different from the first conductivity type. In various non-limiting embodiments as shown in FIG. 1B, the entire third conductivity region 121 may have the second conductivity type and the second conductivity type may be P type. In other words, the third conductivity region 121 may include only P type dopants and may be a P+ region in some exemplary non-limiting embodiments. However, the second conductivity type may be N type in alternative non-limiting embodiments and the third conductivity region 121 may be an N+ region in some exemplary non-limiting embodiments. The first memory cell 1001a may further include a first gate 141 and a second gate 142 arranged over the third conductivity region 121. The first gate 141 may include a first gate electrode 141a and a first oxide layer 141b. Similarly, the second gate 142 may include a second gate electrode 142a and a second oxide layer 142b. Each of the first and second gates 141, 142 may further include spacers 141c, 142c adjacent to the gate electrodes 141a, 142a and the oxide layers 141b, 142b. Each further memory cell 1001b-1001n may be substantially similar to the first memory cell 1001a. For example, the second memory cell 1001b may include a fourth conductivity region 122 arranged at least partially within the first conductivity region 102, and third and fourth gates 143, 144 arranged over the fourth conductivity region 122, and each further memory cell (e.g. memory cell 1001n) may include a further conductivity region (e.g. conductivity region 123) and further gates (e.g. gates 145, 146) arranged over the further conductivity region (e.g. conductivity region 123). The fourth conductivity region 122 and each further conductivity region (e.g. conductivity region 123) may be substantially similar to the third conductivity region 121. For example, similar to the third conductivity region 121, at least a part of each of the fourth and further conductivity regions 122-123 may have the second conductivity type. For instance, in an exemplary non-limiting embodiment as shown in FIG. 1B, each of the third, fourth and further conductivity regions 121-123 may be entirely of the second conductivity type and may be a P+ region, but these conductivity regions 121-123 may be N+ regions in alternative non-limiting embodiments. Further, each of the third, fourth and further gates 143-146 may similarly include a gate electrode 143a-146a, an oxide layer 143b-146b and spacers 143c-146c. In various non-limiting embodiments, the gate electrodes 141a-146a may be formed of a conductive material, such as polysilicon in a non-limiting embodiment, but other conductive materials, such as metals or alloys, for example, titanium nitride (TiN), tantalum nitride (TaN), tungsten, and combinations thereof may also be used. In various non-limiting embodiments, the oxide layers 141b-146b may be formed of any oxide material known in the art, such as, but not limited to, high-k dielectrics (e.g. hafnium dioxide (HfO$_2$)) or silicon dioxide (SiO$_2$). In various non-limiting embodiments, the spacers 141c-146c may include insulating material such as, but not limited to, silicon oxide, silicon nitride, silicon oxynitride, other types of dielectric materials or combinations thereof.

In various non-limiting embodiments, the second conductivity region 104 may have a higher doping concentration (in other words, include more dopants) than the first conductivity region 102. Further, the second conductivity region 104 may have approximately equal doping concentration as the third and each further conductivity region 121-123. However, as described above, the second conductivity region 104 may include dopants of the first conductivity type (e.g. may be a N+ region in an exemplary non-limiting embodiment); whereas the third and further conductivity regions 121-123 may include dopants of the second conductivity type different from the first conductivity type (e.g. may be P+ regions in an exemplary non-limiting embodiment). In various non-limiting embodiments, the doping concentration of the first conductivity region 102 (having the first conductivity type) may range from about $10^{14}$ cm$^{-3}$ to about $10^{16}$ cm$^{-3}$, the doping concentration of the second conductivity region 104 (having the first conductivity type) may range from about $2\times10^{14}$ cm$^3$ to about $2\times10^{16}$ cm$^{-3}$, and the doping concentration of the third, and each further conductivity region 121-123 (having the second conductivity type different from the first conductivity type) may range from about $2\times10^{14}$ cm$^3$ to about $2\times10^{16}$ cm$^{-3}$. In various non-limiting embodiments, the implant material for each conductivity region 102, 104, 121-123 of the memory device 100 may be the same implant material, for example, an epitaxial silicon material in an exemplary non-limiting embodiment. The P type material may be or include, but is not limited to epitaxial silicon germanium and/or the N type material may be or include, but is not limited to doped silicon material including N type dopants. P type dopants can for example, include but are not limited to boron (B), aluminium (Al), indium (In) or a combination thereof, while N type dopants can include carbon (C), phosphorus (P), arsenic (As), antimony (Sb), or a combination thereof. Other types of implant materials and dopants as known to those skilled in the art may also be useful for forming the conductivity regions 102, 104, 121-123 of the memory device 100.

In various non-limiting embodiments as shown in FIG. 1B, the memory segment 100a may include an isolation region 160 arranged at least partially within the first conductivity region 102 between the second conductivity region 104 and the third conductivity region 121. This isolation region 160 may be optional, in other words, may be absent in alternative non-limiting embodiments. In addition, the memory segment 100a may also include further isolation regions 161, 162, 163 arranged at least partially within the first conductivity region 102 between adjacent memory cells 1001a-1001n. These further isolation regions 161, 162, 163 may help to reduce the voltage interference between the memory cells 1001a-1001n. In various non-limiting embodiments, each further isolation region 161-163 may be arranged between the conductivity regions 121-123 of adjacent memory cells 1001a-1001n. For example, as shown in FIG. 1B, the memory segment 100a may include an isolation region 161 arranged between the third conductivity region 121 and the fourth conductivity region 122. As described above, the third conductivity region 121, fourth conductivity region 122 and each further conductivity region (e.g. conductivity region 123) may be substantially similar, and may have a same conductivity type. The memory segment 100a may also include another isolation region 164 arranged between the last memory cell 1001n and one end of the first conductivity region 102. In various non-limiting embodiments, the isolation regions 160-164 may include an isolation material, such as but not limited to a gap fill oxide or nitride, or a combination of both. In various non-limiting embodiments, the isolation regions 160-164 may be shallow trench isolation (STI) regions.

In various non-limiting embodiments as shown in FIG. 1B, the second conductivity region 104 of the memory segment 100a may be coupled to a source line 107a (SL$_1$). Hence, the second conductivity region 104 together with the first conductivity region 102 may serve as the source line 107a of the memory device 100. Further, each of the gates 141-146 may be coupled to a respective word line 180a-180n (WL$_1$-WL$_n$). For example, the first gate 141 may be coupled to a first word line 180a (WL$_1$), the second gate 142 may be coupled to a second word line 180b (WL$_2$), the third gate 143 may be coupled to a third word line 180c (WL$_3$) and the fourth gate 144 may be coupled to a fourth word line 180d (WL$_4$). In various non-limiting embodiments, the source lines (SL$_1$-SL$_m$) 107a-107m and the word lines (WL$_1$-WL$_n$) 180a-180n may be formed of any conductive material, such as, but not limited to aluminium, copper, tungsten, alloys thereof or combinations thereof. Referring to FIGS. 1A and 1B, in various non-limiting embodiments, a portion of each memory segment 100a-100m (e.g. portion 120 of memory segment 100a) including a word line (WL$_1$-WL$_n$) 180a-180n, a gate 141-146, part of a conductivity region 121-123 having the second conductivity type and part of the first conductivity region 102 serving as the source line (SL$_1$-SL$_n$) 107a-107m, may form a bitcell (e.g. bitcell 120) that may be programmed. Accordingly, each memory cell 1001a-1001n may include two bitcells and may hence be referred to as a two bit memory cell.

Referring to FIG. 1A, each source line (SL$_1$-SL$_m$) 107a-107m of the memory device 100 may have a width (e.g. width 107w) and a height (e.g. height 107h). In an exemplary non-limiting embodiment as shown in FIG. 1A, the width 107w and height 107h may be the same and may be about 0.04 um according to the 28 nm design rule. However, the width 107w and height 107h need not be the same in alternative non-limiting embodiments that may use different technology nodes. Further, each word line (WL$_1$-WL$_n$) 180a-180n may have a width (e.g. 181w) of about 0.03 um according to 28 nm design rule in an exemplary non-limiting embodiment.

Each of the first conductivity regions 102 may have a width 102w of about 0.26 um according to the 28 nm design rule in an exemplary non-limiting embodiment. The third, fourth and further conductivity regions 121-123 having the second conductivity type may each have a length (e.g. length 122l) and a width (e.g. width 122w), where the length 122l and the width 122w may be the same and may range from about 0.12 um to about 0.23 um in various non-limiting embodiments. A bitcell (e.g. bitcell 120) of each memory segment 100a-100m may have a length 120l, a width 120w and a cell area of 120l×120w. The length 120l may be about 0.52 um according to the 28 nm design rule in an exemplary non-limiting embodiment. The width 120w may be about 0.07 um according to the 28 nm design rule in an exemplary non-limiting embodiment.

A distance 110 between the second conductivity region 104 and the third conductivity region 121 of each memory segment 100a-100m may be about 0.06 um according to the 28 nm design rule in an exemplary non-limiting embodiment. In various non-limiting embodiments, a distance 112, 114 between adjacent word lines 180a-180n may be the same. The distance 112, 114 may be about 0.06 um according to the 28 nm design rule in an exemplary non-limiting embodiment. However, in alternative non-limiting embodiments, the distance 112 between adjacent word lines (e.g. word line 180a (WL$_1$) and word line 180b (WL$_2$)) coupled to a same memory cell (e.g. memory cell 1001a) may be different from the distance 114 between adjacent word lines (e.g. word line 180b (WL$_2$) and word line 180c (WL$_3$)) coupled to different memory cells (e.g. memory cells 1001a, 1001b). A distance 116 between the first conductivity regions 102 of adjacent memory segments 100a-100m may be about 0.26 um according to the 28 nm design rule in an exemplary non-limiting embodiment. Further, a distance 118 between adjacent conductivity regions 121-123 having the second conductivity type (e.g. between the third conductivity region 121 and the fourth conductivity region 122) may be about 0.06 um according to the 28 nm design rule in an exemplary non-limiting embodiment. In various non-limiting embodiments, a size of each cell 1001a-1001n of the memory device 100 may be about 0.0294 um$^2$ and a distance between consecutive cells may be about 37.6 um after shrinking the cells 1001a-1001n for application of technologies between 14 nm and 22 nm technologies. In various non-limiting embodiments, the size of each memory cell 1001a-1001n of the memory device 100 may be smaller as compared to prior art memory cells, and this may in turn enhance scalability. For example, the size of each memory cell 1001a-1001n may be about 65 percent to 80 percent of the size of a prior art memory cell.

Figure 1C:
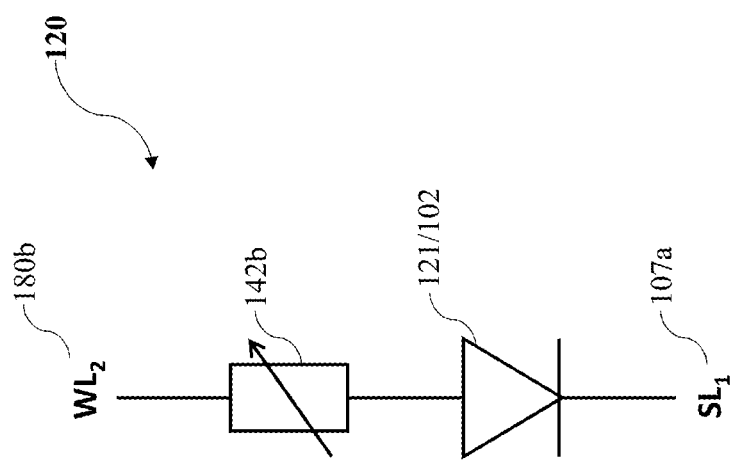
FIG. 1C shows an equivalent circuit of a bitcell of the memory segment of FIG. 1B.
Figure 1D:
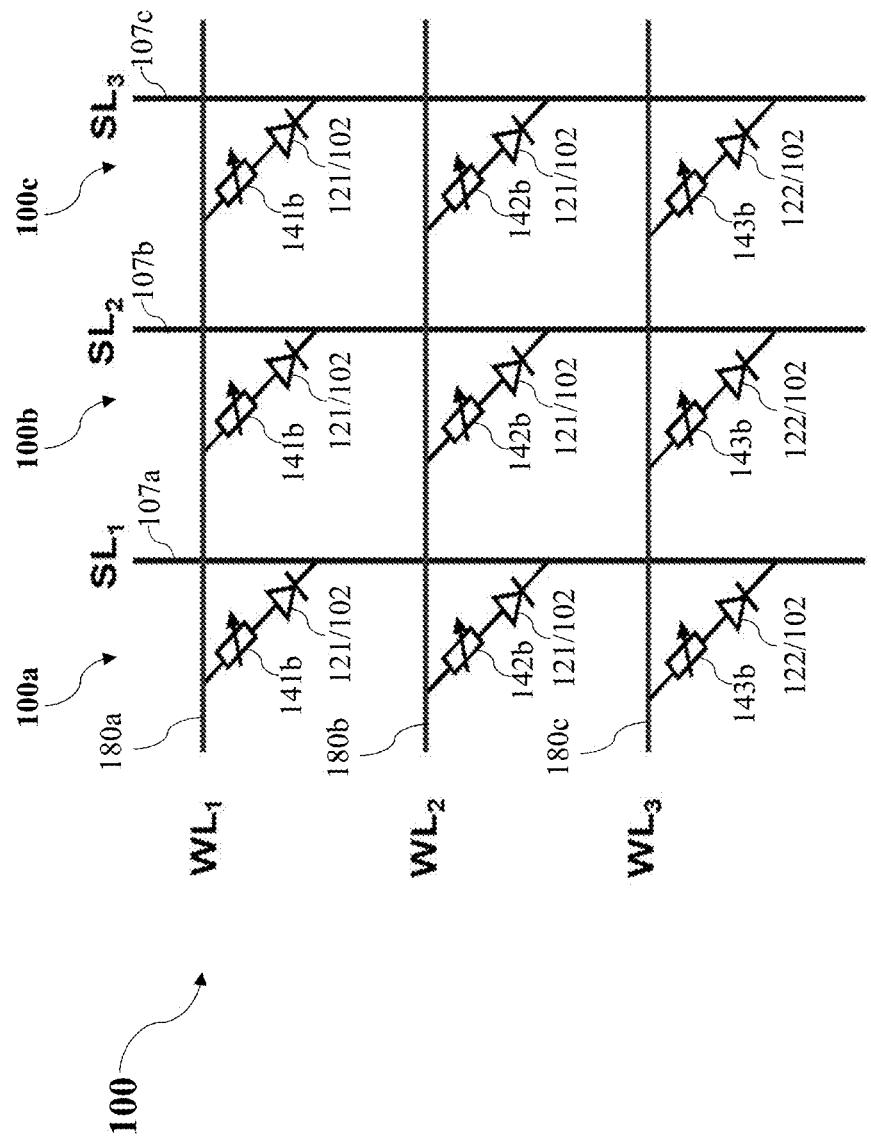
FIG. 1D shows an equivalent circuit of the memory device of FIG. 1A in an exemplary non-limiting embodiment.

FIG. 1C shows an equivalent circuit of the bitcell 120 of the memory segment 100a of FIG. 1B. As shown in FIG. 1C, the third conductivity region 121 and the first conductivity region 102 may together act as a reverse diode 121/102, and the oxide layer 142b of the second gate 142 may serve as an anti-fuse mechanism for programming the bitcell 120 corresponding to the second gate 142. FIG. 1D shows an equivalent circuit of the memory device 100 in an exemplary non-limiting embodiment with three memory segments 100a-100c, three word lines (WL$_1$-WL$_3$) 180a-180c and three source lines (SL$_1$-SL$_3$) 107a-107c. As shown in FIG. 1D, each memory segment 100a-100c may include a plurality of bitcells, where each bitcell may include oxide layer 141b-143b arranged in series with a reverse diode 121/102, 122/102 (formed by a conductivity region 121, 122 having the second conductivity type and the first conductivity region 102 having the first conductivity type). Accordingly, in various non-limiting embodiments, the memory device 100 may be referred to as a 1 diode 1 resistor (1D1R) array. The oxide layers 141b-143b may be coupled to respective word lines (WL$_1$-WL$_3$) 180a-180c and may also be coupled to respective source lines (SL$_1$-SL$_3$) 107a-107c via the respective reverse diodes 121/102, 122/102.

In use, each oxide layer 141b-146b may be configured to break down when a voltage difference greater than a program voltage Vprog is applied across the oxide layer 141b-146b. In other words, each oxide layer 141b-146b may be configured to break down when a predetermined write voltage difference Vset (that may be greater than the sum of Vprog and a voltage drop across the reverse diode 121/102, 122/102) is applied between the source line (SL$_1$-SL$_m$) 107a-107m and the word line (WL$_1$-WL$_n$) 180a-180n coupled to the oxide layer 141b-146b. For example, the first oxide layer 141b of the first memory segment 100a may be configured to break down to form a conductive link 131 (see FIG. 1B) between the first gate electrode 141a and the third conductivity region 121 when Vset is applied between the first source line 107a (SL$_1$) and the first word line 180a (WL$_1$). The second oxide layer 142b of the first memory segment 100a may be configured to break down to form a conductive link 132 (see FIG. 1B) between the second gate electrode 142a and the third conductivity region 121 when Vset is applied between the first source line 107a (SL$_1$) and the second word line 180b (WL$_2$). Each bit of the memory device 100 may correspond to a bitcell (e.g. bitcell 120) having an oxide layer 141b-146b and the bit (or bitcell) may be programmed by breaking down the corresponding oxide layer 141b-146b with the application of Vset between the selected word line 180a-180n and source line 107a-107m coupled to the oxide layer 141b-146b. The reverse diodes 121/102, 122/102 may act as embedded selectors to help direct currents through the memory device 100 and prevent spurious currents from flowing through the oxide layers 141b-143b coupled to unselected word lines 181-186 and source lines 107-109. This can in turn help reduce erroneous programming of unselected bits.

Table 1 shows the voltages that may be applied to the word lines 180a-180n and source lines 107a-107m when using the memory device 100 as an OTP memory device in various non-limiting embodiments. As shown in Table 1, to program a selected bitcell, a write voltage of Vset may be applied to the selected word line 180a-180n and the selected source line 107a-107m may be grounded (hence, a voltage difference between the selected word line 180a-180n and the selected source line 107a-107m may be Vset). Further, an inhibit voltage of Vinhibit may be applied to each of the remaining unselected word lines 180a-180n and unselected source lines 107a-107m or alternatively, the remaining unselected word lines 180a-180n and unselected source lines 107a-107m may be set floating. To read a selected bitcell, a read voltage of Vread may be applied to the selected word line 180a-180n and the selected source line 107a-107m may be grounded. Further, the remaining unselected word lines 180a-180n and unselected source lines 107a-107m may be applied a voltage of Vinhibit, grounded or set floating. In various non-limiting embodiments, the inhibit voltage Vinhibit may be set as approximately half of the write voltage Vset using the V/2 write scheme.

TABLE 1

| OTP Bias Table | | WL (V) | SL (V) |
|---|---|---|---|
| Program | Selected | Vset | 0 |
|  | Unselected | Vinhibit or Floating | Vinhibit or Floating |
| Read | Selected | Vread | 0 |
|  | Unselected | Vinhibit, 0 or Floating | Vinhibit, 0 or Floating |

Table 2 shows the voltages that may be applied to the word lines 180a-180n and source lines 107a-107m when using the memory device 100 as a unipolar MTP memory device in various non-limiting embodiments. As shown in Table 2, to program or read a selected bitcell, voltages similar to those described above with reference to Table 1 may be applied to the word lines 180a-180n and source lines 107a-107m. However, the bitcells may also be erased when using the memory device 100 as a MTP memory device. This may be performed by applying a reset voltage Vreset to the selected word line 180a-180n and grounding the selected source line 107a-107m, while applying an inhibit voltage Vinhibit (which may for example, be approximately half of the write voltage Vset) to the remaining unselected word lines 180a-180n and source lines 107a-107m or setting these remaining unselected word lines 180a-180n and source lines 107a-107m to float. In various non-limiting embodiments, each oxide layer 141b-146b may be configured to reset when a voltage difference lower than an erase voltage Verase is applied across the oxide layer 141b-146b, and the reset voltage Vreset may be lower than a sum of Verase and a voltage drop across the reverse diode 121/102, 122/102.

TABLE 2

| MTP Bias Table | | WL (V) | SL (V) |
|---|---|---|---|
| Program | Selected | Vset | 0 |
|  | Unselected | Vinhibit or Floating | Vinhibit or Floating |
| Erase | Selected | Vreset | 0 |
|  | Unselected | Vinhibit or Floating | Vinhibit or Floating |
| Read | Selected | Vread | 0 |
|  | Unselected | Vinhibit, 0 or Floating | Vinhibit, 0 or Floating |

Figure 2:
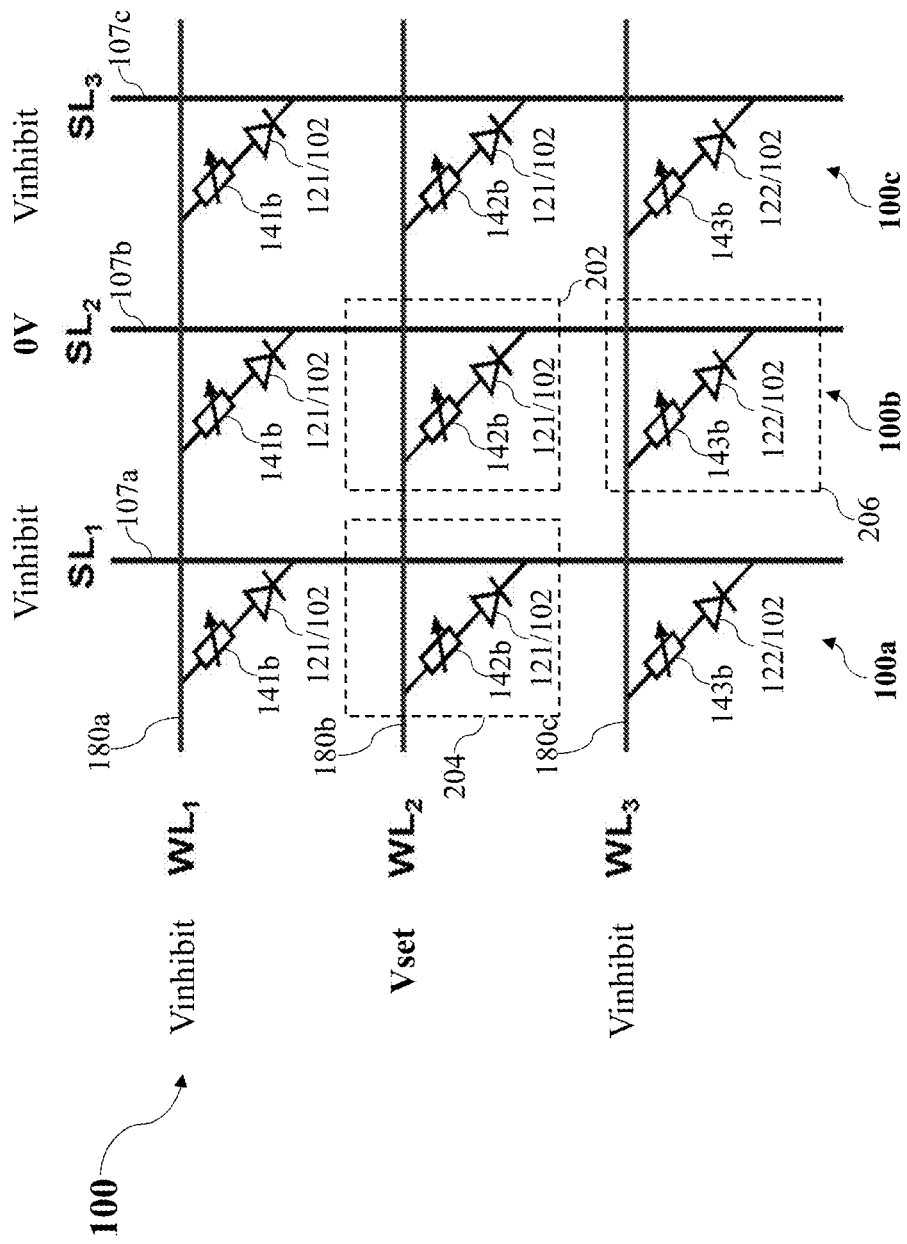
FIG. 2 shows the equivalent circuit of FIG. 1D with applied voltages for a first exemplary non-limiting embodiment where the memory device may be used as an OTP memory device and for a second exemplary non-limiting embodiment where the memory device may be used as a MTP memory device.

FIG. 2 shows the equivalent circuit of FIG. 1D with applied voltages for a first exemplary non-limiting embodiment where the memory device 100 may be a 28 nm OTP memory device, and for a second exemplary non-limiting embodiment where the memory device 100 may be a 16 nm unipolar MTP memory device.

In the first non-limiting exemplary embodiment where the memory device 100 may be a 28 nm OTP memory device, Vprog may range from about 3.2V to about 4.2V. To program the bitcell 202, a voltage Vset of about 5V may be applied to the second word line (WL$_2$) 180b, the second source line (SL$_2$) 107b may be grounded and a voltage Vinhibit of about 2.5V may be applied to the remaining word lines (WL$_1$, WL$_3$) 180a, 180c and source lines (SL$_1$, SL$_3$) 107a, 107c. Accordingly, a voltage difference of about 5V may arise between the second word line (WL$_2$) 180b and the second source line (SL$_2$) 107b; whereas, a voltage difference ranging from 0V to 2.5V may arise between the remaining pairs of word lines 180a-180c and source lines 107a-107c. In addition, a turn on voltage or a voltage drop across each reverse diode 121/102, 122/102 may be about 0.7V (as opposed to a turn on voltage of about 0.3V for each transistor in prior art cells).

Referring to the bitcell 202 of FIG. 2, a voltage drop across the second oxide layer 142b of the second memory segment 100b may hence be about (Vset−0V)−0.7V=5V−0.7V=4.3V. Since this voltage drop of 4.3V is greater than Vprog, the second oxide layer 142b of the second memory segment 100b (in other words, the oxide layer 142b of the bitcell 202) may break down and a conductive link may be formed between the second gate electrode 142a and the third conductivity region 121 of the second memory segment 100b. This may program the bitcell 202. The voltage drops across the remaining oxide layers 141b, 142b, 143b may not be sufficient to break down these oxide layers 141b, 142b, 143b and accordingly, the remaining bitcells may not be programmed. For example, referring to the bitcell 204 of FIG. 2, a voltage drop across the second oxide layer 142b of the first memory segment 100a may be about (Vset−Vinhibit)−0.7V=2.5V−0.7V=1.8V, and referring to the bitcell 206 of FIG. 2, a voltage drop across the third oxide layer 143b of the second memory segment 100b may be about (Vinhibit−0V)−0.7V=2.5V−0.7V=1.8V. Since these voltage drops of 1.8V are less than Vprog, the second and third oxide layers 142b, 143b of the first and second memory segments 100a, 100b respectively may not break down, and the corresponding bitcells 204, 206 may not be programmed.

In the second non-limiting exemplary embodiment where the memory device 100 may be a 16 nm unipolar MTP memory device, Vprog may be about 2V and Verase may be about 1.7V. To program the bitcell 202, a voltage Vset of about 3V may be applied to the second word line (WL$_2$) 180b, the second source line (SL$_2$) 107b may be grounded and a voltage Vinhibit of about 1.5V may be applied to the remaining word lines (WL', WL$_3$) 180a, 180c and source lines (SL$_1$, SL$_3$) 107a, 107c. Accordingly, a voltage difference of about 3V may arise between the second word line (WL$_2$) 180b and the second source line (SL$_2$) 107b; whereas, a voltage difference ranging from 0V to 1.5V may arise between the remaining pairs of word lines (WL$_1$-WL$_3$) 180a-180c and source lines (SL$_1$-SL$_3$) 107a-107c. In addition, a voltage drop across each reverse diode 121/102, 122/102 may be about 0.7V.

Referring to the bitcell 202 of FIG. 2, a voltage drop across the second oxide layer 142b of the second memory segment 100b may hence be about (Vset–0V)–0.7V=3V–0.7V=2.3V. Since this voltage drop of 2.3V is greater than Vprog, the second oxide layer 142b of the second memory segment 100b (in other words, the oxide layer 142b of the bitcell 202) may break down and a conductive link may be formed between the second gate electrode 142a and the third conductivity region 121 of the second memory segment 100b. This may program the bitcell 202. The voltage drops across the remaining oxide layers 141b, 142b, 143b may not be sufficient to break down these oxide layers 141b, 142b, 143b and accordingly, the remaining bitcells may not be programmed. For example, referring to the bitcell 204 of FIG. 2, a voltage drop across the second oxide layer 142b of the first memory segment 100a may be about (Vset–Vinhibit)–0.7V=1.5V–0.7V=0.8V, and referring to the bitcell 206 of FIG. 2, a voltage drop across the third oxide layer 143b of the second memory segment 100b may be about (Vinhibit–0V)–0.7V=1.5V–0.7V=0.8V. Since these voltage drops of 1.8V are less than Vprog, the second and third oxide layers 142b, 143b of the first memory segment 100a and second memory segment 100b respectively may not break down, and the corresponding bitcells 204, 206 may not be programmed.

Figure 3:
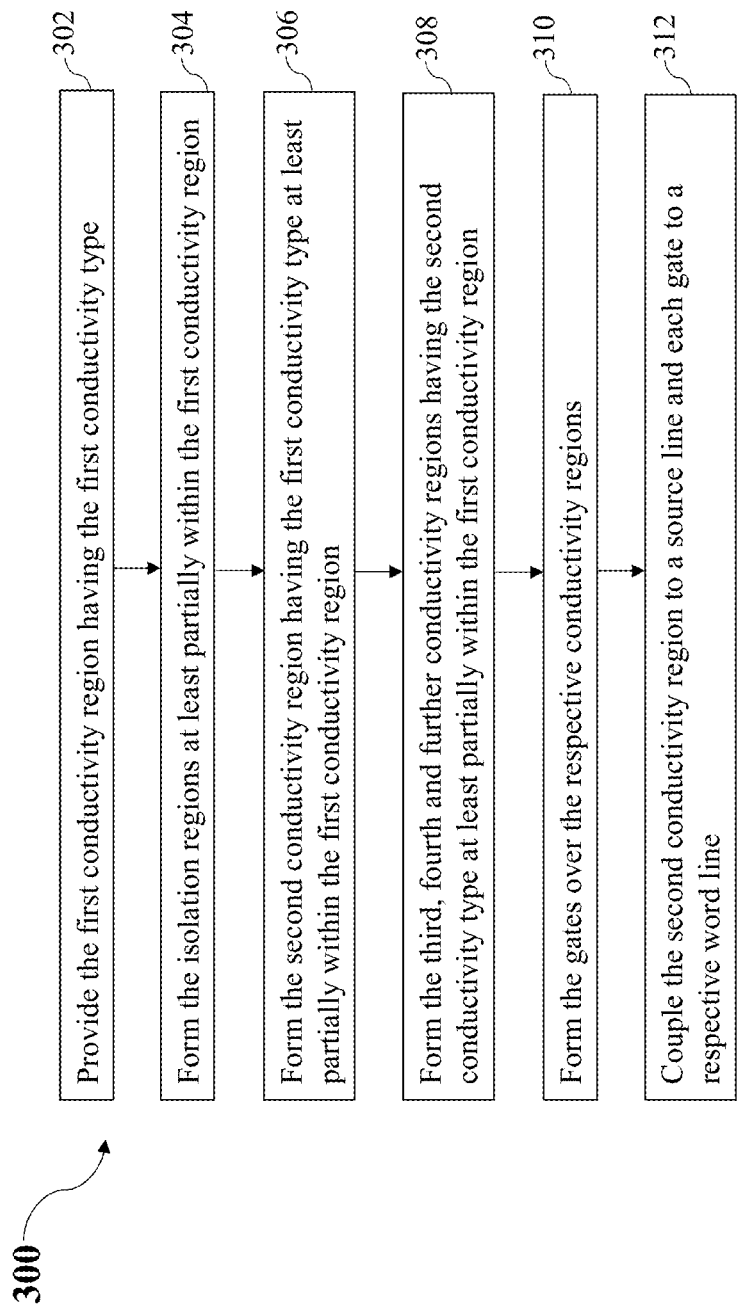
FIG. 3 shows a flow chart of a method for forming the memory segment of FIG. 1B according to various non-limiting embodiments.

FIG. 3 shows a flow chart of a method 300 for forming one of the memory segments (e.g. memory segment 100a of FIG. 1B) of the memory device 100 according to various non-limiting embodiments. As shown in FIG. 3, the method 300 may begin (at 302) by providing the first conductivity region 102 having the first conductivity type. The method 300 may then form (at 304) the isolation regions 160-164 at least partially within the first conductivity region 102 using any method known to those skilled in the art. For example, a mask may be formed over the first conductivity region 102 to expose the regions of the first conductivity region 102 intended for the isolation regions 160-164. These exposed regions may then be etched to form trenches and the trenches may be filled with isolation material to form the isolation regions 160-164. Next, the method 300 may form (at 306) the second conductivity region 104 having the first conductivity type at least partially within the first conductivity region 102. The method may then proceed to form (at 308) the third, fourth and further conductivity regions 121-123 having the second conductivity type at least partially within the first conductivity region 102. In various non-limiting embodiments, the second conductivity region 104 may be formed by injecting dopants having the first conductivity type into the first conductivity region 102, and the third, fourth and further conductivity regions 121-123 may be formed by injecting dopants having the second conductivity type into the first conductivity region 102. In various non-limiting embodiments, the injection of dopants into the first conductivity region 102 may be performed without a mask, for example, it may be performed using methods such as, but not limited to, ion injection. The method 300 may then proceed to form (at 310) the gates 141-146 over the respective conductivity regions 121-123. For example, the method may form the first and second gates 141, 142 over the third conductivity region 121, and the third and fourth gates 143, 144 over the fourth conductivity region 122. In various non-limiting embodiments, the gates 141-146 may be formed simultaneously by for example, depositing an oxide material, depositing conductive material over the oxide material, and etching the oxide and conductive material simultaneously using a mask. In various non-limiting embodiments, the spacers 141c-146c may be grown from the etched conductive material. Next, the method may couple (at 312) the second conductivity region 104 to a source line (SL$_1$) 107a and each gate 141-146 to a respective word line (WL$_1$-WL$_n$) 180a-180n. For example, the method may couple the first gate 141 to a first word line (WL$_1$) 180a, the second gate 142 to a second word line (WL$_2$) 180b, the third gate 143 to a third word line (WL$_3$) 180c and the fourth gate 144 to a fourth word line (WL$_4$) 180d. The word lines (WL$_1$-WL$_n$) 180a-180n, source lines (SL$_1$-SL$_m$) 107a-107m and via contacts for coupling the memory device 100 to the word lines (WL$_1$-WL$_n$) 180a-180n and source lines (SL$_1$-SL$_m$) 107a-107m may be formed using any method as known to a person skilled in the art, such as, but not limited to a conventional front end of line (FEOL) process.

The above described order for the method 300 is only intended to be illustrative and the method 300 is not limited to the above specifically described order unless otherwise specifically stated. For example, the gates 141-146 may be formed before forming the conductivity regions 104, 121-123. Further, in various non-limiting embodiments, the memory segments 100a-100m of the memory device 100 may be formed simultaneously by performing each of 302-312 of the method 300 for the different memory segments 100a-100m simultaneously.

By including only source lines 107a-107m and word lines 180a-180n, the memory device 100 may be a compact memory device with high packing density. Further, forming the memory device 100 may not require any additional mask as compared to forming typical prior art anti-fuse memory devices. In other words, the memory device 100 may be a free device.

In various alternative non-limiting embodiments, each of the third conductivity region 121, fourth conductivity region 122 and further conductivity regions (e.g. conductivity region 123) of the memory device 100 may include both the first conductivity type and the second conductivity type. In some exemplary non-limiting embodiments, each of these conductivity regions 121-123 may have a higher doping concentration of the first conductivity type than the second conductivity type. However, the doping concentrations of the first and second conductivity types may be the same in alternative non-limiting embodiments. In some exemplary non-limiting embodiments, each of the conductivity regions 121-123 may include alternating segments of the first conductivity type with segments of the second conductivity type. These alternating segments may be vertically alternating segments, horizontally alternating segments, or combinations thereof.

Figure 4:
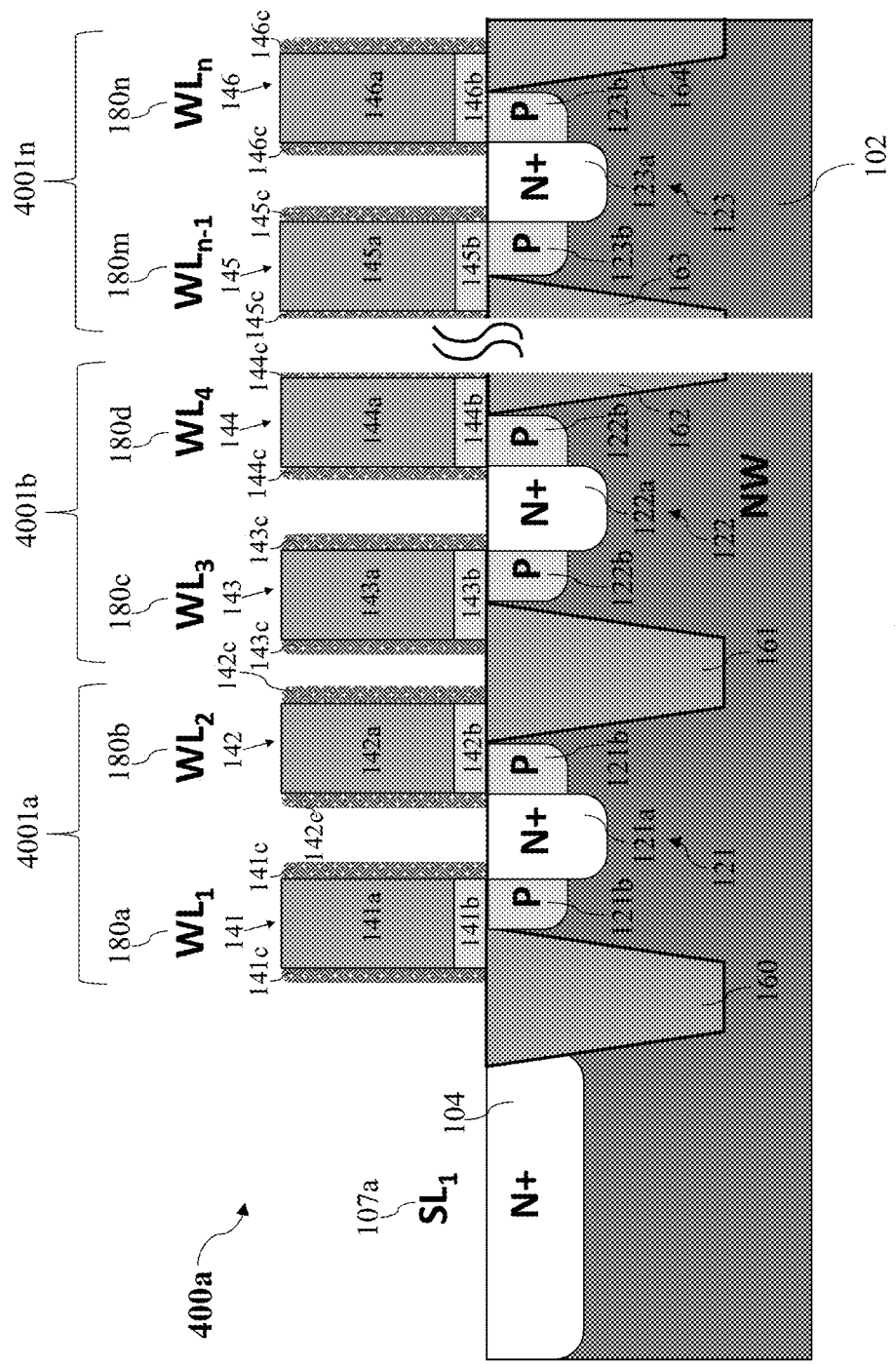
FIG. 4 shows a cross-sectional view of a memory segment of a memory device according to alternative non-limiting embodiments.

FIG. 4 shows a simplified cross-sectional view of a memory segment 400a of a memory device according to alternative non-limiting embodiments. The memory segment 400a may be similar to the memory segment 100a and may also include a plurality of memory cells 4001a, 4001b-4001n similar to the memory cells 1001a-1001n of the memory device 100, and thus the common features are labelled with the same reference numerals and need not be discussed.

As shown in FIG. 4, each of the third conductivity region 121, fourth conductivity region 122 and further conductivity regions (e.g. conductivity region 123) of the memory segment 400a may include laterally alternating segments 121a-123a of a first conductivity type with segments 121b-123b of the second conductivity type, where the doping concentration of the first conductivity type may be higher than the doping concentration of the second conductivity type. In the exemplary non-limiting embodiment as shown in FIG. 4, each of these conductivity regions 121-123 may include a segment 121a-123a of the first conductivity type arranged between a pair of segments 121b-123b of the second conductivity type, and each segment 121b-123b of the second conductivity type may be arranged at least partially below one of the gates 141-146. Further, the segments 121a-123a of the first conductivity type may extend deeper into the first conductivity region 102 than the segments 121b-123b of the second conductivity type. Each segment 121a-123a of the first conductivity type, together with an adjacent segment 121b-123b of the second conductivity type, may function as a reverse diode similar to the reverse diodes 121/102, 122/102 in the equivalent circuit of FIG. 1D. In this exemplary non-limiting embodiment as shown in FIG. 4, the first conductivity type may be N type and the second conductivity type may be P type. However, the conductivity types of the regions 102, 104 and segments 121a-123a, 121b-123b of the memory segment 400a may be reversed in alternative non-limiting embodiments. The memory segment 400a may be formed using a method similar to method 300 as described above and may not require any additional mask as compared to forming a typical anti-fuse memory device.

Figure 5A:
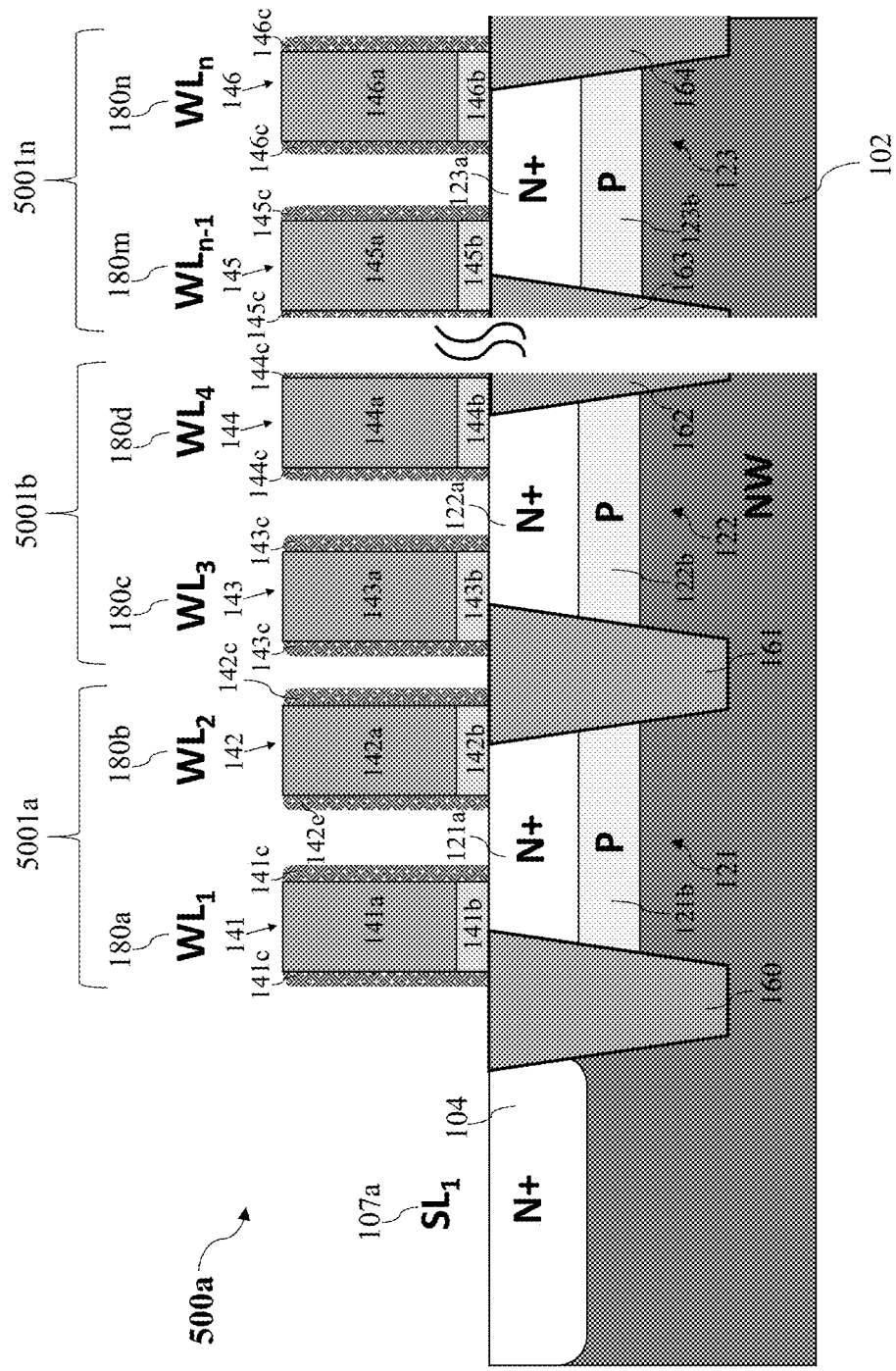
FIG. 5A shows a cross-sectional view of a memory segment of a memory device according to alternative non-limiting embodiments.

FIG. 5A shows a simplified cross-sectional view of a memory segment 500a of a memory device according to alternative non-limiting embodiments. The memory segment 500a may be similar to the memory segment 100a and may also include a plurality of memory cells 5001a, 5001b-5001n similar to the memory cells 1001a-1001n of the memory device 100, and thus the common features are labelled with the same reference numerals and need not be discussed.

As shown in FIG. 5A, each of the third conductivity region 121, fourth conductivity region 122 and further conductivity regions (e.g. conductivity region 123) of the memory segment 500a may include vertically alternating segments 121a-123a of a first conductivity type with segments 121b-123b of the second conductivity type, where the doping concentration of the first conductivity type may be higher than the doping concentration of the second conductivity type. In the exemplary non-limiting embodiment as shown in FIG. 5A, each of these conductivity regions 121-123 may include a segment 121a-123a of the first conductivity type and a segment 121b-123b of the second conductivity type, where the segment 121b-123b of the second conductivity type may be arranged deeper within the first conductivity region 102 (in other words, further from the gates 141-146) than the segment 121a-123a of the first conductivity type. Said differently, each segment 121a-123a of the first conductivity type may be arranged between a segment 121b-123b of the second conductivity type and a pair of gates 141-146. In this exemplary non-limiting embodiment, the first conductivity type may be N type and the second conductivity type may be P type. However, the conductivity types of the regions 102, 104 and segments 121a-123a, 121b-123b of the memory segment 500a may be reversed in alternative non-limiting embodiments. The memory segment 500a may be formed using a method similar to method 300 as described above. For example, the deeper segments 121b-123b of the conductivity regions 121-123 having the second conductivity type may be formed by injecting dopants into the first conductivity region 102 without a mask in some exemplary non-limiting embodiments. However, in alternative exemplary non-limiting embodiments, the deeper segments 121b-123b of the conductivity regions 121-123 having the second conductivity type may be formed by doping the first conductivity region 102 with a mask. For example, forming the deeper segments 121b-123b of the second conductivity type may include forming a mask over the first conductivity region 102, where the mask may include a plurality of openings to expose portions of the first conductivity region 102, and doping the exposed portions of the first conductivity region 102 through the mask with dopants having the second conductivity type. This may help to achieve a more uniform doping of these deeper segments 121b-123b as compared to injecting dopants into the first conductivity region 102 without a mask.

Figure 5B:
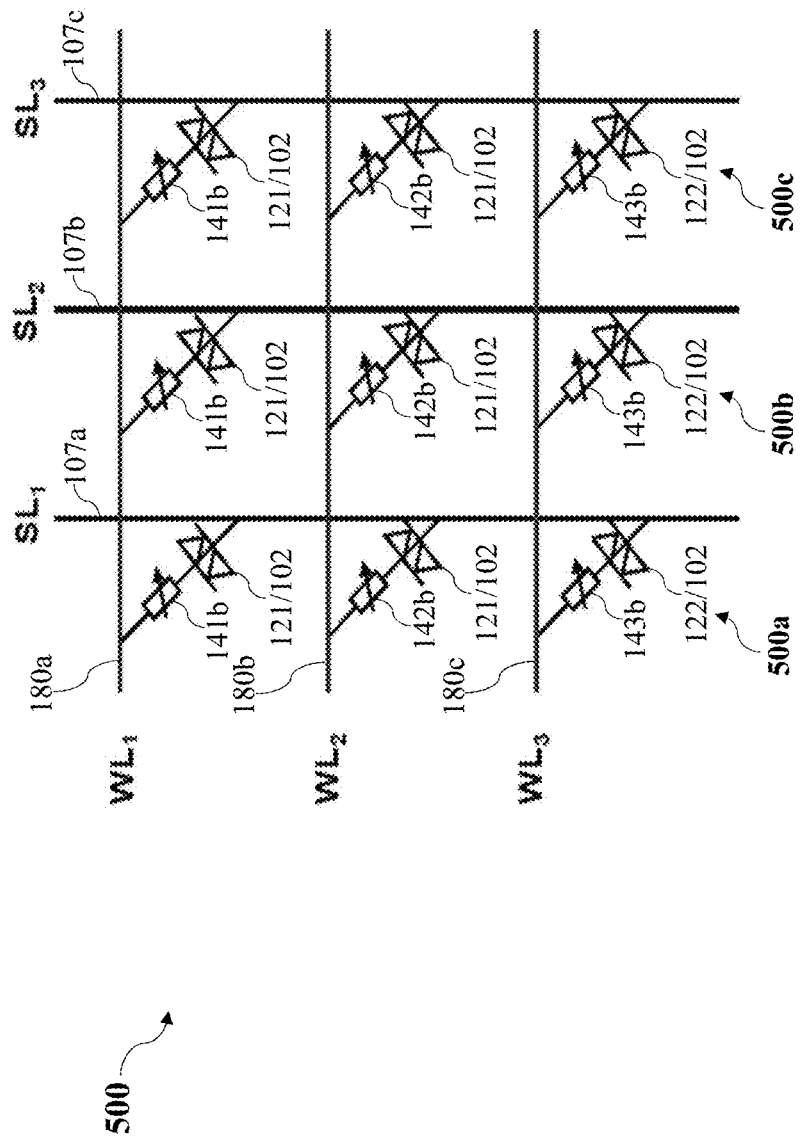
FIG. 5B shows an equivalent circuit of a memory device that may include the memory segment of FIG. 5A in an exemplary non-limiting embodiment.

FIG. 5B shows an equivalent circuit of a memory device 500 in an exemplary non-limiting embodiment, where the memory device 500 may include the memory segment 500a as a first memory segment 500a, and second and third memory segments 500b, 500c substantially similar to the first memory segment 500a. In this exemplary non-limiting embodiment, there may be three word lines ($WL_1$-$WL_3$) 108a-108c and three source lines ($SL_1$-$SL_3$) 107a-107c. The memory device 500 may be used as an OTP memory device, a unipolar MTP memory device or a bipolar MTP memory device. As shown in FIG. 5B, the arrangement of the segments 121a-123a, 121b-123b with respect to the first conductivity region 102 in each memory segment 500a, 500b, 500c may form a plurality of biristors 121/102, 122/102 that may act as selectors. Each biristor 121/102, 122/102 may be arranged in series with a respective oxide layer 141b-143b that may act as an anti-fuse mechanism. Accordingly, in various non-limiting embodiments, the memory device 500 may be referred to as a 1 selector 1 resistor (1S1R) array.

Table 3 shows the voltages that may be applied to the word lines 180a-180n and the source lines 107a-107m when using the memory device 500 as a MTP memory device in various non-limiting embodiments. As shown in Table 3, when using the memory device 500 as a unipolar MTP memory device, the voltages applied to the word lines 180a-180n and the source lines 107a-107m may be similar to those shown in Table 2. However, when the memory device 500 is used as a bipolar MTP memory device, the voltages applied to the word lines 180a-180n and the source lines 107a-107m during an erasing operation may be different from those shown in Table 2. In particular, in various non-limiting embodiments, a reset voltage Vreset may be applied to the selected source line 107a-107m and the selected word line 180a-180n may be grounded to erase the selected bitcell, and the remaining unselected word lines 180a-180n and source lines 107a-107m may be applied an inhibit voltage Vinhibit or set floating. In various non-limiting embodiments, the inhibit voltage Vinhibit may be set as approximately half of the write voltage Vset.

TABLE 3

| MTP Bias Table | | WL (V) | SL (V) |
|---|---|---|---|
| Program | Selected | Vset | 0 |
| | Unselected | Vinhibit or Floating | Vinhibit or Floating |
| Erase (When the memory device 500 is an unipolar MTP memory device) | Selected | Vreset | 0 |
| | Unselected | Vinhibit or Floating | Vinhibit or Floating |
| Erase (When the memory device 500 is a bipolar MTP memory device) | Selected | 0 | Vreset |
| | Unselected | Vinhibit or Floating | Vinhibit or Floating |
| Read | Selected | Vread | 0 |
| | Unselected | Vinhibit, 0 or Floating | Vinhibit, 0 or Floating |

Figure 6:
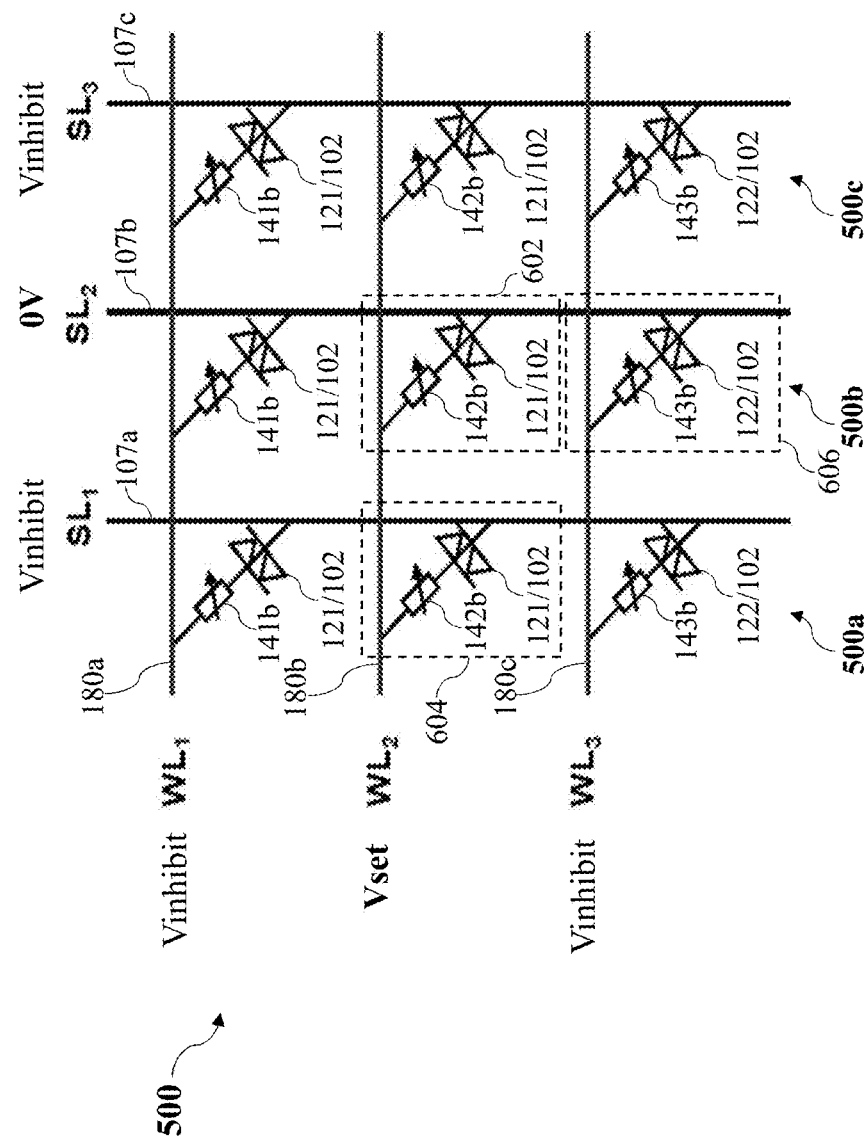
FIG. 6 shows the equivalent circuit of FIG. 5B with applied voltages for a first exemplary non-limiting embodiment where the memory device may be used as an OTP memory device and for a second exemplary non-limiting embodiment where the memory device may be used as a MTP memory device.

FIG. 6 shows the equivalent circuit of FIG. 5B with applied voltages for a first exemplary non-limiting embodiment where the memory device 500 may be a 28 nm OTP memory device and for a second exemplary non-limiting embodiment where the memory device 500 may be a 16 nm MTP memory device.

In the first non-limiting exemplary embodiment where the memory device 500 may be a 28 nm OTP memory device, Vprog may range from about 3.2V to about 4.2V. To program the bitcell 602, a write voltage Vset of about 7V may be applied to the second word line (WL$_2$) 180b, the second source line (SL$_2$) 107b may be grounded and an inhibit voltage Vinhibit of about 3.5V may be applied to the remaining word lines (WL$_1$, WL$_3$) 180a, 180c and source lines (SL$_1$, SL$_3$) 107a, 107c. Accordingly, a voltage difference of about 7V may arise between the second word line (WL$_2$) 180b and the second source line (SL$_2$) 107b; whereas, a voltage difference ranging from 0V to 3.5V may arise between the remaining pairs of word lines 180a-180n and source lines 107a-107m. In addition, a voltage drop across each biristor 121/102, 122/102 may be about 2V.

Referring to the bitcell 602 of FIG. 6, a voltage drop across the second oxide layer 142b of the second memory segment 500b may hence be about (Vset−0V)−2V=7V−2V=5V. Since this voltage drop of 5V is greater than Vprog, the second oxide layer 142b of the second memory segment 100b (in other words, the oxide layer 142b of the bitcell 602) may break down and a conductive link may be formed between the second gate electrode 142a and the third conductivity region 121 of the second memory segment 100b. This may program the bitcell 602. The voltage drops across the remaining oxide layers 141b, 142b, 143b may not be sufficient to break down these oxide layers 141b, 142b, 143b and accordingly, the remaining bitcells may not be programmed. For example, referring to the bitcell 604 of FIG. 6, a voltage drop across the second oxide layer 142b of the first memory segment 100a may be about (Vset−Vinhibit)−2V=3.5V−2V=1.5V. Referring to the bitcell 606 of FIG. 6, a voltage drop across the third oxide layer 143b of the second memory segment 500b may be about (Vinhibit−0V)−2V=3.5V−2V=1.5V. Since these voltage drops of 1.5V are less than Vprog, the second and third oxide layers 142b, 143b of the first and second memory segments 500a, 500b respectively may not break down, and the corresponding bitcells 604, 606 may not be programmed.

In the second non-limiting exemplary embodiment where the memory device 500 may be a 16 nm MTP memory device, Vprog may be about 2V and Verase may be about 1.7V. To program the bitcell 602, a write voltage Vset of about 4.2V may be applied to the second word line (WL$_2$) 180b, the second source line (SL$_2$) 107b may be grounded and an inhibit voltage Vinhibit of about 2.1V may be applied to the remaining word lines (WL$_1$, WL$_3$) 180a, 180c and source lines (SL$_1$, SL$_3$) 107a, 107c. Accordingly, a voltage difference of about 4.2V may arise between the second word line (WL$_2$) 180b and the second source line (SL$_2$) 107b; whereas, a voltage difference ranging from 0V to 2.1V may arise between the remaining pairs of word lines 180a-180c and source lines 107a-107c. In addition, a voltage drop across each biristor 121/102, 122/102 may be about 2V.

Referring to the bitcell 602 of FIG. 6, a voltage drop across the second oxide layer 142b of the second memory segment 500b may hence be about (Vset−0V)−2V=4.2V−2V=2.2V. Since this voltage drop of 2.2V is greater than Vprog, the second oxide layer 142b of the second memory segment 100b (in other words, the oxide layer 142b of the bitcell 602) may break down and a conductive link may be formed between the second gate electrode 142a and the third conductivity region 121 of the second memory segment 100b. This may program the bitcell 602. The voltage drops across the remaining oxide layers 141b, 142b, 143b may not be sufficient to break down these oxide layers 141b, 142b, 143b and accordingly, the remaining bits may not be programmed. For example, referring to the bitcell 604 of FIG. 6, a voltage drop across the second oxide layer 142b of the first memory segment 100a may be about (Vset−Vinhibit)−2V=2.1V−2V=0.1V. Referring to the portion 606 of FIG. 6, a voltage drop across the third oxide layer 143b of the second memory segment 500b may be about (Vinhibit−0V)−2V=2.1V−2V=0.1V. Since these voltage drops of 0.1V are less than Vprog, the second and third oxide layers 142b, 143b of the first and second memory segments 500a, 500b respectively may not break down, and the corresponding bitcells 604, 606 may not be programmed.

In various non-limiting embodiments, the memory devices 200, 500 may be capable of operating with both higher voltages and lower voltages. For example, as described above, the bitcell 202 of the memory device 200 may be programmed regardless of whether the applied write voltage Vset is higher (e.g. 5V in the first non-limiting exemplary embodiment with reference to FIG. 2) or lower (e.g. 3V in the second non-limiting exemplary embodiment with reference to FIG. 2). Similarly, as described above, the bitcell 602 of the memory device 500 may be programmed regardless of whether the applied write voltage Vset is higher (e.g. 7V in the first non-limiting exemplary embodiment with reference to FIG. 6) or lower (e.g. 4.2V in the second non-limiting exemplary embodiment with reference to FIG. 6). A memory device having memory segments similar to the memory segment 400a of FIG. 4 may also be capable of operating with both higher and lower voltages.

The following examples pertain to further embodiments.

Example 1 may be a memory device including: a first conductivity region having a first conductivity type; a second conductivity region arranged at least partially within the first conductivity region, wherein the second conductivity region may be coupled to a source line and may have the first conductivity type; a third conductivity region arranged at least partially within the first conductivity region, wherein at least a part of the third conductivity region may have a second conductivity type different from the first conductivity type; a first gate arranged over the third conductivity region and coupled to a first word line, wherein the first gate may include a first gate electrode and a first oxide layer; and a second gate arranged over the third conductivity region and coupled to a second word line, wherein the second gate may include a second gate electrode and a second oxide layer. The first oxide layer may be configured to break down to form a conductive link between the first gate electrode and the third conductivity region when a predetermined write voltage difference is applied between the source line and the first word line. The second oxide layer may be configured to break down to form a conductive link between the second gate electrode and the third conductivity region when the predetermined write voltage difference is applied between the source line and the second word line.

In Example 2, the subject matter of Example 1 may optionally include that the entire third conductivity region may have the second conductivity type.

In Example 3, the subject matter of Example 1 may optionally include that the third conductivity region may include the first conductivity type and the second conductivity type.

In Example 4, the subject matter of Example 3 may optionally include that the third conductivity region may have a higher doping concentration of the first conductivity type than the second conductivity type.

In Example 5, the subject matter of Example 3 or Example 4 may optionally include that the third conductivity region may include alternating segments of the first conductivity type with segments of the second conductivity type.

In Example 6, the subject matter of Example 5 may optionally include that the alternating segments may be vertically alternating segments, horizontally alternating segments, or combinations thereof.

In Example 7, the subject matter of any one of Examples 1 to 6 may optionally include that the memory device may further include a fourth conductivity region arranged at least partially within the first conductivity region, wherein at least a part of the fourth conductivity region may have the second conductivity type; a third gate arranged over the fourth conductivity region, wherein the third gate may be coupled to a third word line; and the memory device may further include an isolation region arranged between the third conductivity region and the fourth conductivity region.

In Example 8, the subject matter of any one of Examples 1 to 7 may optionally include that the second conductivity region may include a higher doping concentration than the first conductivity region.

In Example 9, the subject matter of any one of Examples 1 to 8 may optionally include that the memory device may further include an isolation region arranged between the second conductivity region and the third conductivity region.

In Example 10, the subject matter of any one of Examples 1 to 9 may optionally include that the first conductivity region may be a well region.

In Example 11, the subject matter of any one of Examples 1 to 10 may optionally include that the first conductivity type may be N type and the second conductivity type may be P type.

Example 12 may be a method including: providing a first conductivity region having a first conductivity type; forming a second conductivity region at least partially within the first conductivity region, wherein the second conductivity region may have the first conductivity type; forming a third conductivity region at least partially within the first conductivity region, wherein at least a part of the third conductivity region may have a second conductivity type different from the first conductivity type; forming a first gate and a second gate over the third conductivity region, wherein the first gate may include a first gate electrode and a first oxide layer, and the second gate may include a second gate electrode and a second oxide layer; and coupling the second conductivity region to a source line, the first gate to a first word line and the second gate to a second word line. The first oxide layer may be configured to break down to form a conductive link between the first gate electrode and the third conductivity region when a predetermined write voltage difference is applied between the source line and the first word line. The second oxide layer may be configured to break down to form a conductive link between the second gate electrode and the third conductivity region when the predetermined write voltage difference is applied between the source line and the second word line.

In Example 13, the subject matter of Example 12 may optionally include that the entire third conductivity region may have the second conductivity type.

In Example 14, the subject matter of Example 12 may optionally include that the third conductivity region may include the first conductivity type and the second conductivity type.

In Example 15, the subject matter of Example 14 may optionally include that the third conductivity region may include alternating segments of the first conductivity type with segments of the second conductivity type.

In Example 16, the subject matter of Example 15 may optionally include that the alternating segments may be vertically alternating segments, horizontally alternating segments, or combinations thereof.

In Example 17, the subject matter of Example 15 or Example 16 may optionally include that the method may further include injecting dopants having the second conductivity type into the first conductivity region without a mask to form the segments of the second conductivity type of the third conductivity region.

In Example 18, the subject matter of Example 15 or Example 16 may optionally include that the method may further include forming a mask over the first conductivity region, wherein the mask may include a plurality of openings to expose portions of the first conductivity region; and doping the exposed portions of the first conductivity region through the mask with dopants having the second conductivity type to form the segments of the second conductivity type of the third conductivity region.

In Example 19, the subject matter of any one of Examples 12 to 18 may optionally include that the method may further include forming an isolation region; forming a fourth conductivity region at least partially within the first conductivity region, wherein at least a part of the fourth conductivity region may have the second conductivity type and wherein the isolation region may be arranged between the third conductivity region and the fourth conductivity region; forming a third gate over the fourth conductivity region; and coupling the third gate to a third word line.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A memory device comprising:
   a first conductivity region, wherein the entire first conductivity region has a first conductivity type;
   a second conductivity region arranged at least partially within the first conductivity region, wherein the second conductivity region is coupled to a source line and wherein the entire second conductivity region has the first conductivity type;

a third conductivity region arranged at least partially within the first conductivity region, wherein at least a part of the third conductivity region has a second conductivity type different from the first conductivity type;

a first gate arranged over the third conductivity region and coupled to a first word line, wherein the first gate comprises a first gate electrode and a first oxide layer; and a second gate arranged over the third conductivity region and coupled to a second word line, wherein the second gate comprises a second gate electrode and a second oxide layer; and an isolation region comprising electrically insulating material arranged laterally between the second conductivity region and the third conductivity region.

2. The memory device of claim 1, wherein the entire third conductivity region has the second conductivity type.

3. The memory device of claim 1, wherein the third conductivity region comprises the first conductivity type and the second conductivity type.

4. The memory device of claim 3, wherein the third conductivity region has a higher doping concentration of the first conductivity type than the second conductivity type.

5. The memory device of claim 3, wherein the third conductivity region comprises alternating segments of the first conductivity type with segments of the second conductivity type.

6. The memory device of claim 5, wherein the alternating segments are vertically alternating segments, horizontally alternating segments, or combinations thereof.

7. The memory device according to claim 1, further comprising:

a fourth conductivity region arranged at least partially within the first conductivity region, wherein at least a part of the fourth conductivity region has the second conductivity type;

a third gate arranged over the fourth conductivity region, wherein the third gate is coupled to a third word line; and wherein the memory device further comprises an isolation region comprising electrically insulating material arranged between the third conductivity region and the fourth conductivity region.

8. The memory device according to claim 1, wherein the second conductivity region comprises a higher doping concentration than the first conductivity region.

9. The memory device according to claim 1, wherein the first conductivity region is a well region.

10. The memory device according to claim 1, wherein the first conductivity type is N type and the second conductivity type is P type.

11. The memory device of claim 1, wherein there is an absence of a gate over the second conductivity region.

12. The memory device of claim 1, wherein the memory device comprises an anti-fuse memory device.

13. The memory device of claim 1, wherein the memory device comprises a one-time programmable memory device.

14. The memory device of claim 1, wherein the isolation region is arranged within the first conductivity region and extends deeper into the first conductivity region than the second conductivity region and the third conductivity region.

15. The memory device of claim 1, wherein the first gate is arranged partially over the third conductivity region and partially over the isolation region.

* * * * *